United States Patent
Parris et al.

(10) Patent No.: US 7,110,306 B2
(45) Date of Patent: Sep. 19, 2006

(54) DUAL ACCESS DRAM

(75) Inventors: Michael C. Parris, Colorado Springs, CO (US); Oscar Frederick Jones, Jr., Colorado Springs, CO (US); Douglas Blaine Butler, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 57 days.

(21) Appl. No.: 10/878,800

(22) Filed: Jun. 28, 2004

(65) Prior Publication Data

US 2005/0286291 A1    Dec. 29, 2005

(51) Int. Cl.
*G11C 7/00* (2006.01)
(52) U.S. Cl. .................. 365/189.04; 365/196
(58) Field of Classification Search ............ None
See application file for complete search history.

(56) References Cited

U.S. PATENT DOCUMENTS

| | | | |
|---|---|---|---|
| 5,940,329 A * | 8/1999 | Seitsinger et al. | 365/189.05 |
| 5,978,307 A * | 11/1999 | Proebsting et al. | 365/230.05 |
| 6,259,634 B1 | 7/2001 | Kengeri et al. | |
| 6,418,063 B1 * | 7/2002 | Seitsinger et al. | 365/189.05 |
| 6,442,078 B1 * | 8/2002 | Arimoto | 365/189.08 |
| 6,877,071 B1 * | 4/2005 | Sherman | 711/149 |

* cited by examiner

*Primary Examiner*—Thong Q. Le
(74) *Attorney, Agent, or Firm*—William J. Kubida; Peter J. Meza; Hogan & Hartson LLP

(57) ABSTRACT

A dual access DRAM includes first and second sets of data lines. By adding a second set of multiplexing transistors to data lines that are controlled with timing and addressing similar to an existing set of multiplexing transistors, data can be transferred to a second subarray by way of an additional set of data lines. The second set of data lines are additional internal read/write lines used in addition to the normal set of data lines. The second set of data lines are designed to have short lengths with correspondingly low capacitance so that additional loading on the sense amplifiers is small.

19 Claims, 6 Drawing Sheets

DUAL ACCESS DRAM

BACKGROUND OF THE INVENTION

The present invention relates, in general, to the field of integrated circuit dynamic random access memories ("DRAMs"). More particularly, the present invention relates to a DRAM memory architecture that allows reading or writing from outside the integrated circuit while transferring or reading data from the same addressed memory cell to a second DRAM subarray.

Conventional single port ("1T/1C") DRAM cells and associated memory architectures are known in the art. Dual port ("2T/1C") DRAM cells or dual port video RAMs are also known in the art. These dual port video RAMs contain a high speed serial port and a conventional multibit parallel port. One problem with prior art memory cells and architectures is that they only allow one operation such as reading or writing to occur at a time.

Referring now to FIG. 1, a prior art memory architecture 10 is shown including a first set 22 of data lines (INT I/O and complementary INT I/O), DRAM subarrays 12A and 12B, sense amplifier blocks 14A and 14B, as well as row decoding circuits 16A and 16B, and column decoding circuits 18A and 18B. Selection transistors M0 and M1 are used to transfer the sensed data from DRAM subarrays 12A and 12B to data lines 22 upon operation of the "SEL 0" control signal. Similarly, selection transistors M2 and M3 are used to transfer the sensed data from DRAM subarray 12B to data lines 22 upon operation of the "SEL 1" control signal. For the sake of clarity in FIG. 1, the interconnecting bit and word lines are not shown.

Turning now to FIG. 2, a prior art block diagram shows further details of a sense amplifier block 14. As is known in the art, sense amplifier block 14 includes a plurality of sense amplifiers 20A through 20N. Each sense amplifier is coupled to two coupling transistors for transferring the sensed data from the DRAM subarrays to lines 15 and 17, which are coupled to the selection transistors as previously described.

Referring back to FIG. 1, in the prior art memory architecture 10, either the SEL 0 or SEL 1 signals go high to put data from one sense amplifier band 14A or 14B onto the data lines 22. What is not possible is to internally read or transfer that same data, or other data, to any other DRAM subarray.

What is desired, therefore, is a memory architecture that allows reading or writing from outside the integrated circuit while transferring or reading data from the same addressed memory cell to a second DRAM subarray or to transfer data between unrelated DRAM subarrays.

SUMMARY OF THE INVENTION

According to the present invention by adding a second set of multiplexing transistors to data lines that are controlled with timing and addressing similar to an existing set of multiplexing transistors, data can be transferred to a second subarray by way of an additional set of data lines. The second set of data lines are additional internal read/write lines used in addition to the normal set of data lines. The second set of data lines are designed to have short lengths with correspondingly low capacitance so that additional loading on the sense amplifiers is small.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
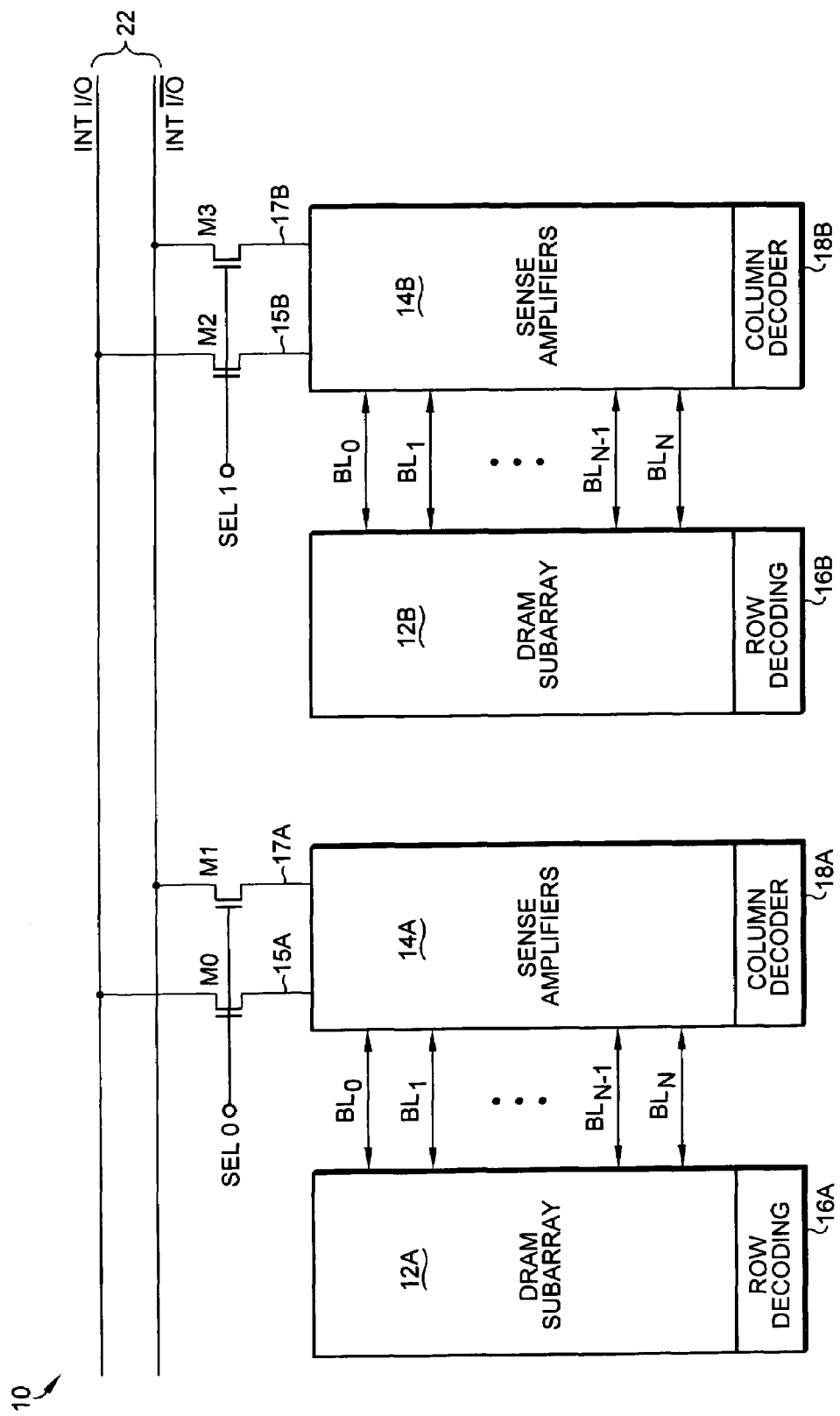
FIG. 1 is a block diagram of a prior art memory architecture in which only one read or write operation is allowed at a time.
Figure 2:
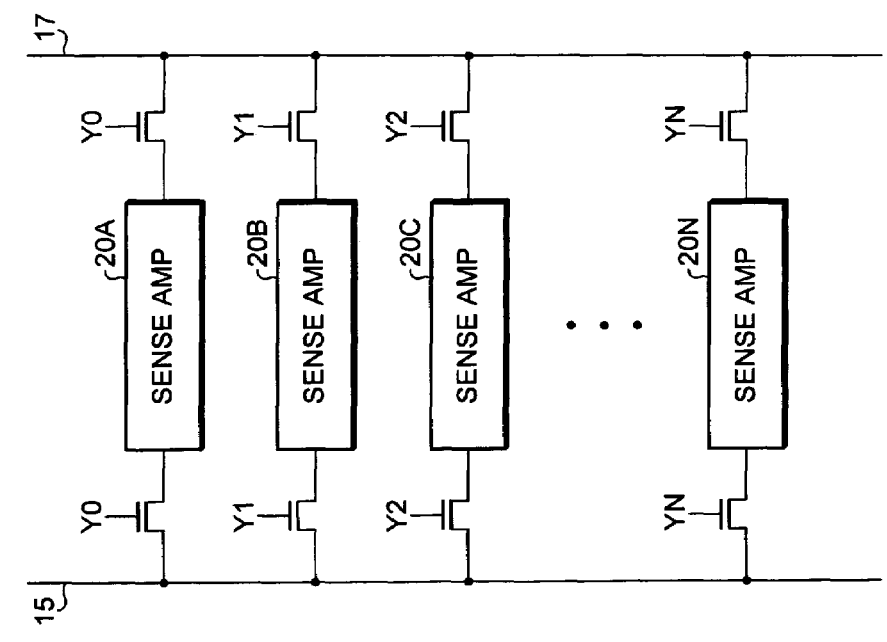
FIG. 2 is a block diagram showing further detail of the sense amplifier blocks shown in FIG. 1.
Figure 3:
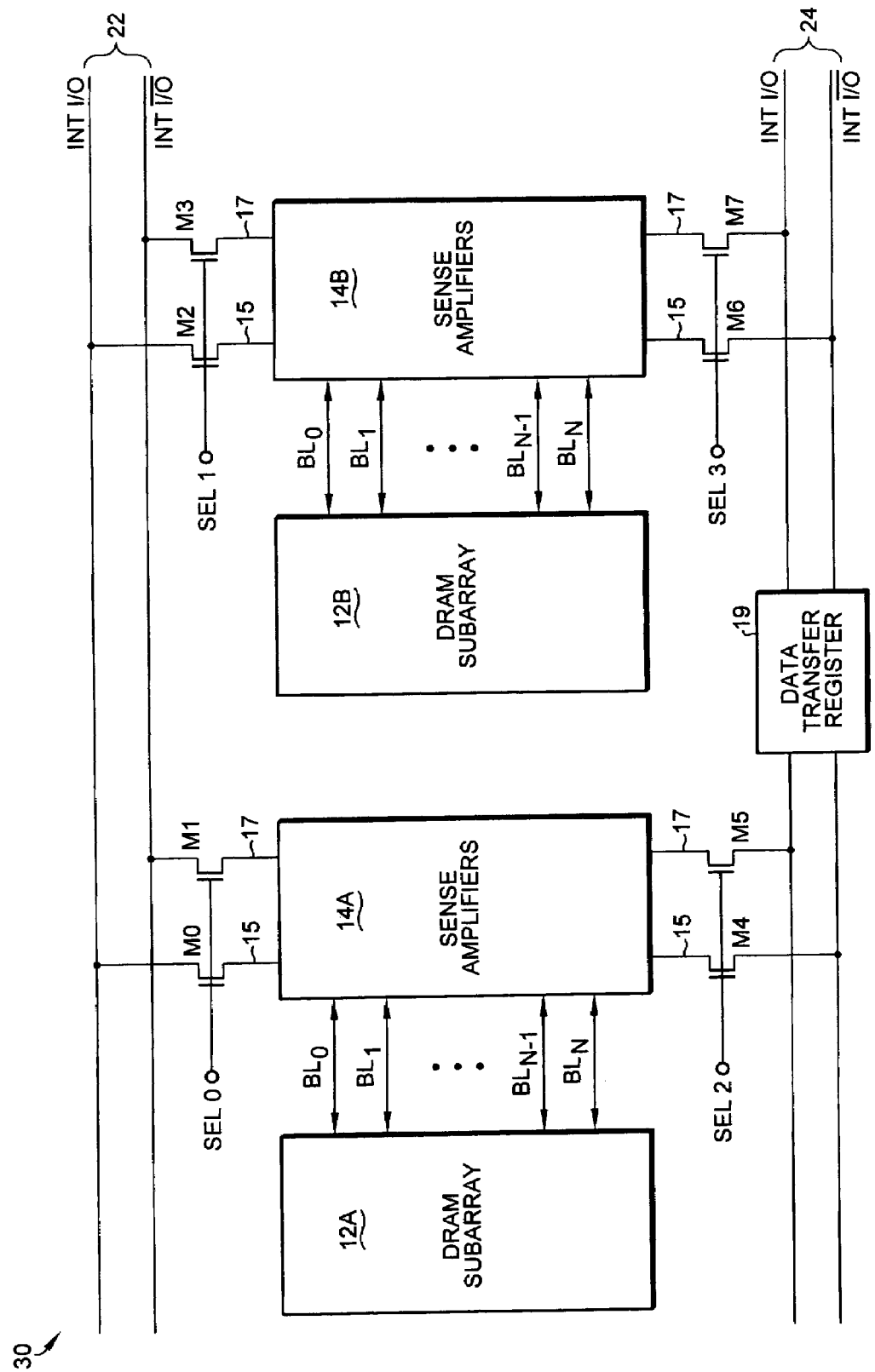
FIG. 3 is a block diagram of a memory architecture according to the present invention including an additional set of data lines in which an additional data read or transfer operation is allowed in additional to the external read or write operation.

Referring now to FIG. 3, a memory architecture according to the present invention includes the same first set of data lines 22, DRAM subarrays 12A and 12B, and sense amplifier blocks 14A and 14B as shown in FIG. 1. Additionally the same selection transistors M0, M1, M2, and M3, as well as corresponding selection control signals SEL 0 and SEL 1 are shown. However, note in FIG. 3, that a second set 24 of data lines is provided. Sense amplifier block 14A is also coupled to the second set of data lines via selection transistors M4 and M5 under control of the "SEL 2" control signal. Sense amplifier block 14B is also coupled to the second set of data lines via selection transistors M6 and M7 under control of the "SEL 3" control signal. The selection transistors are coupled between local data lines 15 and 17 and the second set of data lines 24. A bi-directional data transfer register or buffer 19 is interposed into the second set of data lines 24 between M4/M5 selection circuitry and the M6/M7 selection circuitry. The row and column decoding circuitry is not shown in FIG. 3 for sake of clarity.

In operation, the second set of data lines 24 are used so that data can be transferred from a first DRAM subarray to a second DRAM subarray, while data from a third DRAM subarray can be written or read to the outside world via the first set of data lines 22. Also, both sets of select control signals from a given sense amplifier block (for example, SEL 0 and SEL 2) can go valid so that data from one DRAM subarray can be transferred to another DRAM subarray and that data can be written to or read from the outside word at the same time. In this example, control signal SEL 3 is high and control signal SEL 1 is low. In this way, the same data that is being read or written to the first set of data lines 22 from DRAM subarray 12A is also being transferred to DRAM subarray 12B. The data transfer register 19 assures that there is sufficient drive capability to correctly write the transferred data.

Figure 4:
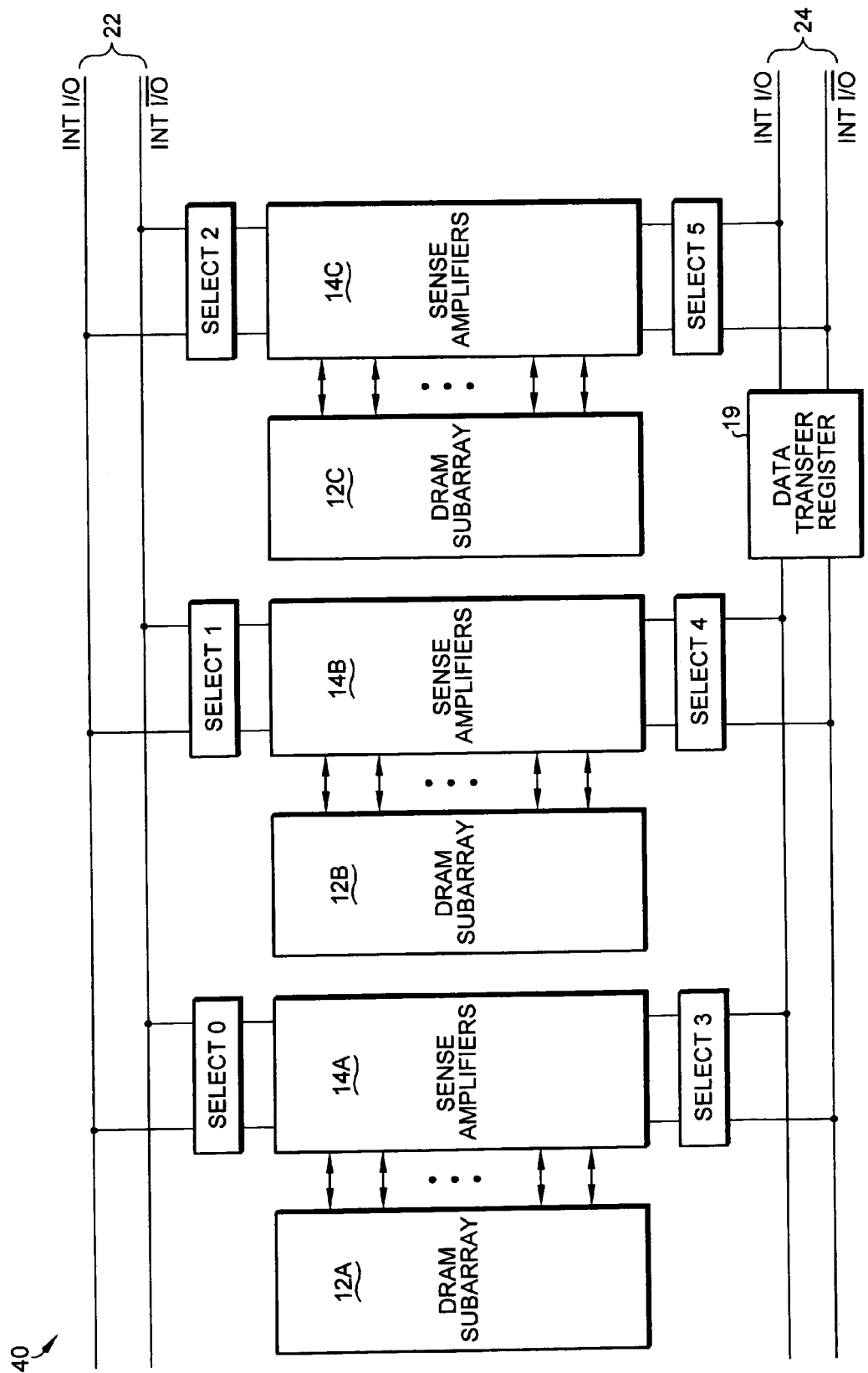
FIG. 4 is a second block diagram of a memory architecture according to the present invention in which three DRAM subarrays and three sense amplifier blocks are shown to demonstrate an additional operational mode.

Referring now to FIG. 4, an expanded view of the memory architecture 40 of the present invention includes DRAM subarrays 12A, 12B, and 12C, as well as sense amplifier blocks or columns 14A, 14B, and 14C. The sense amplifier blocks 14A, 14B, and 14C are coupled to the first and second data line sets 22 and 24 via select circuits SELECT 0–5. The SELECT circuits include the same two selection transistors and control signals as shown in previous FIG. 3. Data transfer registers are shown interposed between the selection circuits associated with the second set 24 of data lines. Data transfer register 19 is interposed between the SELECT 4 and the SELECT 5 selection circuits. The actual select control signal nodes are not shown in FIG. 4.

Still further functionality of memory architecture 40 can be demonstrated with reference to FIG. 4. In particular, while data can be read to or written from the outside world via the first set of data lines 22, data can simultaneously be transferred between unrelated DRAM subarrays.

For example, with proper switching of the appropriate SELECT circuits, data can be read from or written to sense amplifiers 14C, while simultaneously transferring data from sense amplifiers 14C to sense amplifiers 14A or 14B. Similarly, data can be read from or written to sense amplifiers 14B, while simultaneously transferring data from sense amplifiers 14C to sense amplifiers 14A. Finally, data can be read from or written to sense amplifiers 14A, while simultaneously transferring data from sense amplifiers 14C to sense amplifiers 14B.

It will be apparent to those skilled in the art that many modes of operation can be effected with the memory architecture 40 of FIG. 4 or variations thereof, including reading and writing of external data, coupled with transferring the same data or data between unrelated DRAM subarrays as desired. Of course, the number of DRAM subarrays and associated sense amplifier columns is limited only by the requirements of a specific application and the size of the integrated memory circuit.

Figure 5:
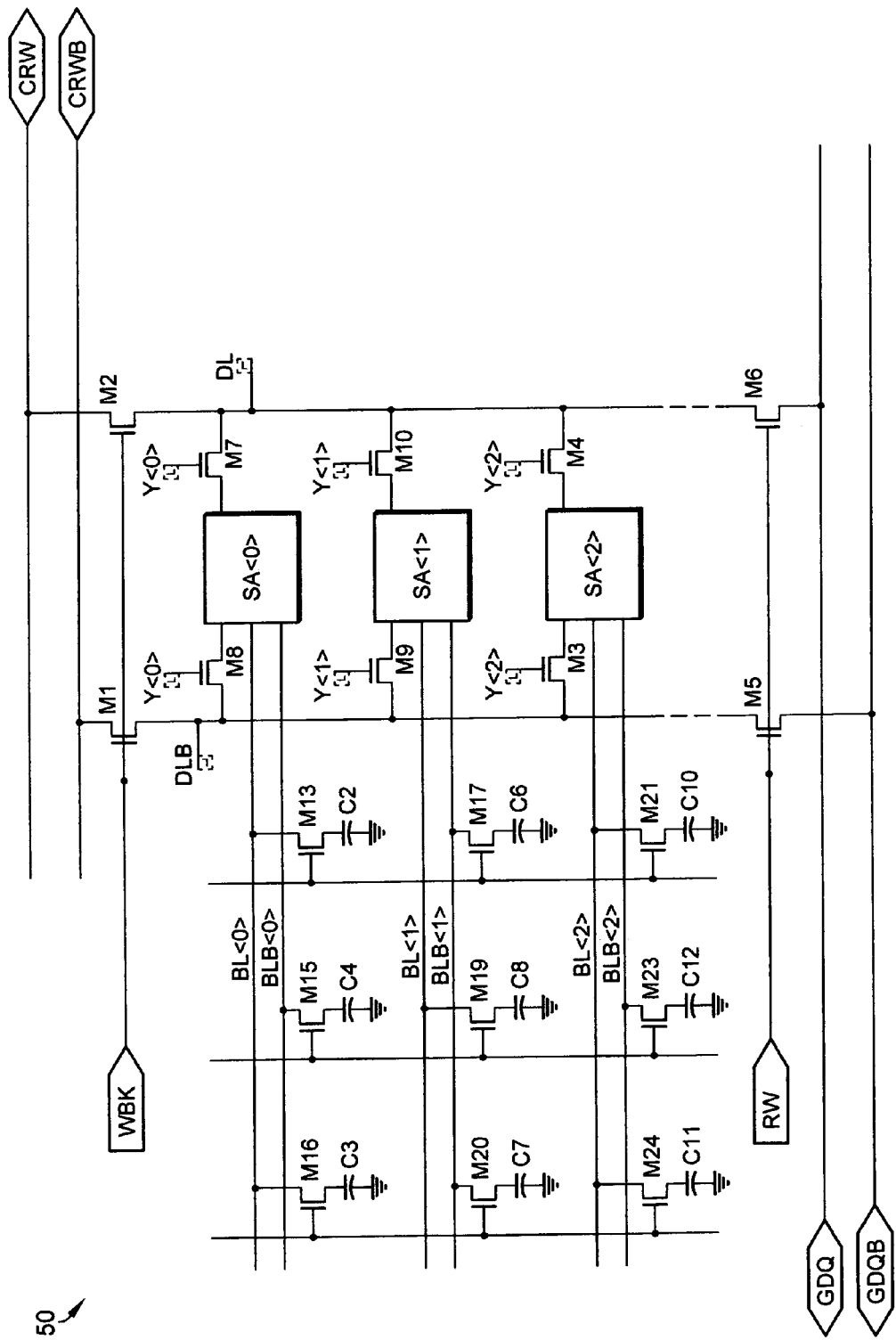
FIG. 5 is a schematic diagram of a portion of a memory array including sense amplifiers and first and second sets of data lines according to the present invention.

Referring now to FIG. 5, a schematic diagram of a portion 50 of a memory subarray including local and global data lines and selection circuitry according to the present invention is shown. In FIG. 5, it is possible to see the actual bit lines BL<0>, BLB<0>, BL<1>, BLB<1>, BL<2>, and BLB<2> that are coupled directly to sense amplifiers SA<0>, SA<1>, and SA<2>, respectively. Transistors M7 and M8, for example, couple the full data levels on sense amplifier SA<0> to the DLB and DL lines. In FIG. 5, transistors M1 and M2 are used to couple the DLB and DL local data lines to the first set of global data lines, labeled CRW and CRWB. The first selection control signal is designated WBK. In FIG. 5, transistors M5 and M6 are used to couple the DLB and DL local data lines to the second set of global data lines, labeled GDQ and GDQB. The second selection control signal is designated RW. Only a portion of a representative DRAM subarray is shown and the numbers of rows and columns of memory cells (e.g. pass transistor M16 and storage capacitor C3) can be extended as required for a particular application.

Figure 6:
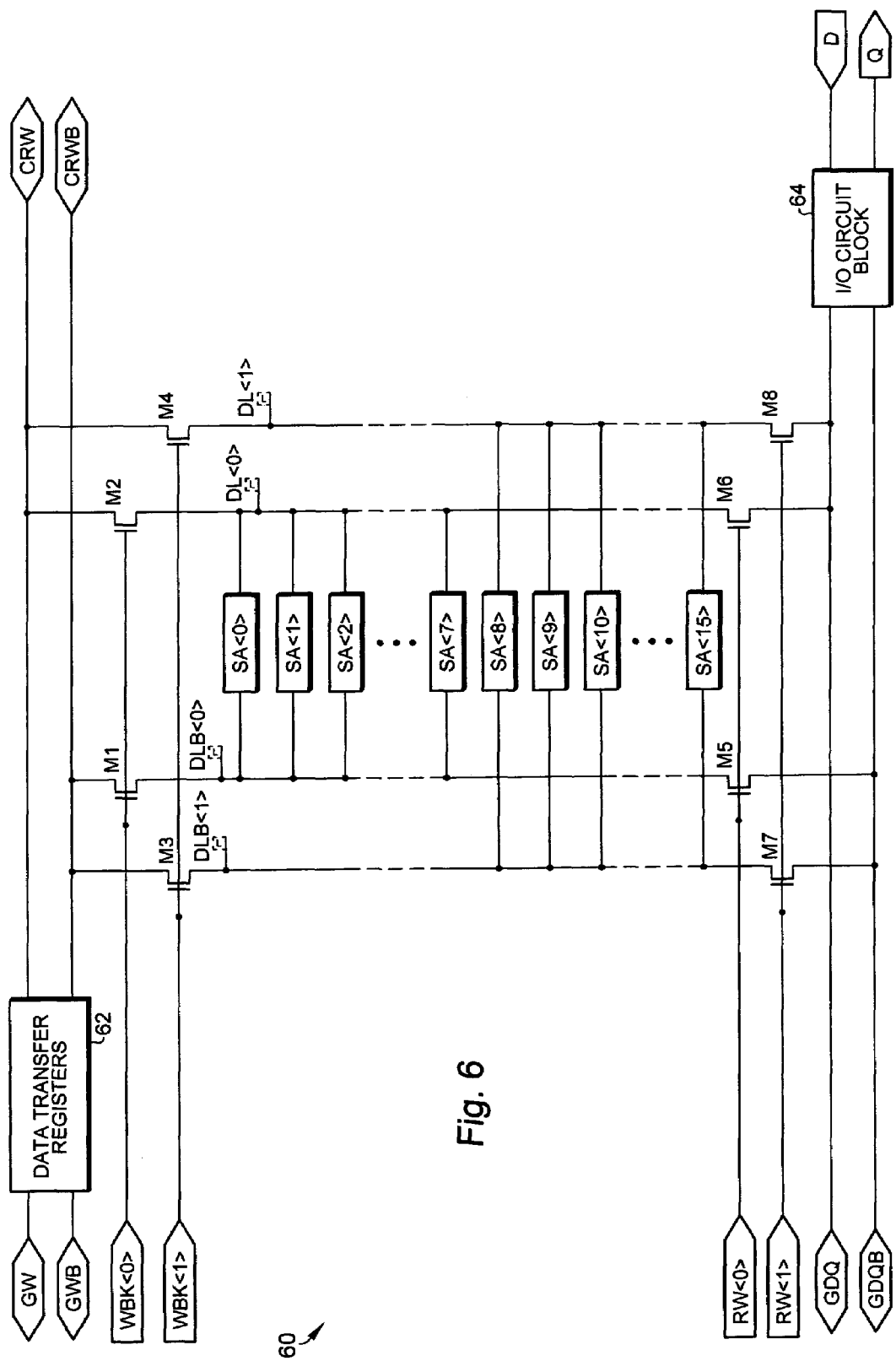
FIG. 6 is a schematic diagram of a sense amplifier block and two sets of selection transistors connected to two sets of data lines according to the present invention

Another embodiment 60 of the present invention is shown in FIG. 6. In the embodiment shown in FIG. 6, first and second sets of selection transistors are used. This arrangement may provide benefits when the circuit is actually configured and laid out on an integrated circuit, as well as having other performance advantages. Note that in FIG. 6, selection transistors M1 and M2 are used to couple the data from sense amplifiers SA<0> through SA<7> to the first set of global data lines CRW and CRWB. Selection transistors M3 and M4 are used to couple the data from sense amplifiers SA<8> through SA<15> to the first set of global data lines CRW and CRWB. Selection transistors M7 and M8 are used to couple the data from sense amplifiers SA<0> through SA<7> to the second set of global data lines GDQ and GDQB. Selection transistors M7 and M8 are used to couple the data from sense amplifiers SA<8> through SA<15> to the second set of global data lines GDQ and GDQB. Note further that there are two select control signal associated with the first set of global data lines, namely WBK<0> for selecting transistors M1 and M2, and WBK<1> for selecting transistors M3 and M4. Similarly, there are two select control signal associated with the second set of global data lines, namely RW<0> for selecting transistors M5 and M6, and RW<1> for selecting transistors M7 and M8.

In FIG. 6 a data transfer register 62 is shown for transferring the data on the local data lines DL<0>, DL<1>, DLB<0>, and DLB<1> to other DRAM subarrays through global data lines GW and GWB. An I/O circuit block 64 is also shown for transferring the data on the GDQ and GDQB global data lines to the external data input and output terminals designated D and Q.

In operation, data can be transferred to either the data transfer registers 62, or the I/O circuit block 64, or both. To transfer data to the data transfer registers 62 only, WBK<0> or WBK<1> are active, and RW<0> and RW<1> are inactive. To transfer data to the I/O circuit block only, WBK<0> and WBK<1> are inactive, and RW<0> or RW<1> are active. To transfer data to both the data transfer registers 62 and to the I/O circuit blocks, either WBK<0> and RW<0> are active and WBK<1> and RW<1> are inactive, or WBK<0> and RW<0> are inactive and WBK<1> and RW<1> are active.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An dual access DRAM comprising:
   a plurality of DRAM subarrays;
   a plurality of sense amplifier columns for sensing data in the DRAM subarrays;
   a first set of data lines;
   a plurality of selection circuits respectively coupled between each sense amplifier column and the first set of data lines for selectively coupling the first set of data lines to the sense amplifier columns;
   a second set of data lines; and
   means for selectively coupling the second set of data lines to the sense amplifier columns,
   wherein the first set of data lines is used for writing external data to a first DRAM subarray, or for providing external data read from a first DRAM subarray, and the second set of data lines is used to simultaneously transfer data between the first DRAM subarray and a second DRAM subarray; and further comprising a data transfer register coupled between a first portion of the second set of data lines and a second portion of the second set of data lines to provide sufficient drive capability to correctly write the transferred data between the first DRAM subarray and the second DRAM.

2. The dual access DRAM of claim 1 wherein each selection circuit comprises:

a first transistor having a current path coupled between the sense amplifier column and a non-inverted data line, and a gate for receiving a selection control signal; and a second transistor having a current path coupled between the sense amplifier column and an inverted data line, and a gate for receiving the selection control signal.

3. The dual access DRAM of claim 1 wherein each selection circuit comprises:

a first transistor having a current path coupled between a first plurality of sense amplifiers in the sense amplifier column and a non-inverted data line, and a gate for receiving a first selection control signal;

a second transistor having a current path coupled between the first plurality of sense amplifiers in the sense amplifier column and an inverted data line, and a gate for receiving the first selection control signal;

a third transistor having a current path coupled between a second plurality of sense amplifiers in the sense amplifier column and a non-inverted data line, and a gate for receiving a second selection control signal; and a fourth transistor having a current path coupled between the second plurality of sense amplifiers in the sense amplifier column and an inverted data line, and a gate for receiving the second selection control signal.

4. The dual access DRAM of claim 1 wherein the means for selectively coupling the second set of data lines to the sense amplifier columns comprises a plurality of selection circuits respectively coupled between each sense amplifier column and the second set of data lines.

5. The dual access DRAM of claim 4 wherein each selection circuit comprises:

a first transistor having a current path coupled between the sense amplifier column and a non-inverted data line, and a gate for receiving a selection control signal; and a second transistor having a current path coupled between the sense amplifier column and an inverted data line, and a gate for receiving the selection control signal.

6. The dual access DRAM of claim 4 wherein each selection circuit comprises:

a first transistor having a current path coupled between a first plurality of sense amplifiers in the sense amplifier column and a non-inverted data line, and a gate for receiving a first selection control signal;

a second transistor having a current path coupled between the first plurality of sense amplifiers in the sense amplifier column and an inverted data line, and a gate for receiving the first selection control signal;

a third transistor having a current path coupled between a second plurality of sense amplifiers in the sense amplifier column and a non-inverted data line, and a gate for receiving a second selection control signal; and a fourth transistor having a current path coupled between the second plurality of sense amplifiers in the sense amplifier column and an inverted data line, and a gate for receiving the second selection control signal.

7. The dual access DRAM of claim 1 in which the second set of data lines is used to simultaneously transfer data between a second DRAM subarray and a third DRAM subarray.

8. An dual access DRAM comprising:

a plurality of DRAM subarrays;

a plurality of sense amplifier columns for sensing data in the DRAM subarrays;

a first set of data lines for reading and writing external data;

a plurality of selection circuits for respectively coupling the first set of data lines to the sense amplifier columns;

a second set of data lines for simultaneously transferring internal data; and a plurality of selection circuits for respectively selectively coupling the second set of data lines to the sense amplifier columns, wherein reading data from or writing data to a first DRAM subarray is performed via the first set of data lines and simultaneously transferring data from the first DRAM subarray to a second DRAM subarray is performed via a second set of data lines; and further comprising a data transfer register coupled between a first portion of the second set of data lines and a second portion of the second set of data lines to provide sufficient drive capability to correctly write the transferred data between the first DRAM subarray and the second DRAM.

9. The dual access DRAM of claim 8 wherein each selection circuit for coupling the first set of data lines to the sense amplifier columns comprises:

a first transistor having a current path coupled between the sense amplifier column and a non-inverted data line, and a gate for receiving a selection control signal; and a second transistor having a current path coupled between the sense amplifier column and an inverted data line, and a gate for receiving the selection control signal.

10. The dual access DRAM of claim 8 wherein each selection circuit for coupling the first set of data lines to the sense amplifier columns comprises:

a first transistor having a current path coupled between a first plurality of sense amplifiers in the sense amplifier column and a non-inverted data line, and a gate for receiving a first selection control signal;

a second transistor having a current path coupled between the first plurality of sense amplifiers in the sense amplifier column and an inverted data line, and a gate for receiving the first selection control signal;

a third transistor having a current path coupled between a second plurality of sense amplifiers in the sense amplifier column and a non-inverted data line, and a gate for receiving a second selection control signal; and a fourth transistor having a current path coupled between the second plurality of sense amplifiers in the sense amplifier column and an inverted data line, and a gate for receiving the second selection control signal.

11. The dual access DRAM of claim 8 wherein each selection circuit for coupling the second set of data lines to the sense amplifier columns comprises:

a first transistor having a current path coupled between the sense amplifier column and a non-inverted data line, and a gate for receiving a selection control signal; and a second transistor having a current path coupled between the sense amplifier column and an inverted data line, and a gate for receiving the selection control signal.

12. The dual access DRAM of claim 8 wherein each selection circuit for coupling the second set of data lines to the sense amplifier columns comprises:
- a first transistor having a current path coupled between a first plurality of sense amplifiers in the sense amplifier column and a non-inverted data line, and a gate for receiving a first selection control signal;
- a second transistor having a current path coupled between the first plurality of sense amplifiers in the sense amplifier column and an inverted data line, and a gate for receiving the first selection control signal;
- a third transistor having a current path coupled between a second plurality of sense amplifiers in the sense amplifier column and a non-inverted data line, and a gate for receiving a second selection control signal; and
- a fourth transistor having a current path coupled between the second plurality of sense amplifiers in the sense amplifier column and an inverted data line, and a gate for receiving the second selection control signal.

13. An dual access DRAM comprising:
- a plurality of DRAM subarrays;
- a plurality of sense amplifier columns for sensing data in the DRAM subarrays;
- a first set of data lines;
- means for selectively coupling the first set of data lines to the sense amplifier columns;
- a second set of data lines; and
- a plurality of selection circuits respectively coupled between each sense amplifier column and the second set of data lines for selectively coupling the second set of data lines to the sense amplifier columns,
- wherein the first set of data lines is used for writing external data to a first DRAM subarray, or for providing external data read from a first DRAM subarray, and the second set of data lines is used to simultaneously transfer data between the first DRAM subarray and a second DRAM subarray; and
- further comprising a data transfer register coupled between a first portion of the second set of data lines and a second portion of the second set of data lines to provide sufficient drive capability to correctly write the transferred data between the first DRAM subarray and the second DRAM.

14. The dual access DRAM of claim 13 wherein the means for selectively coupling the first set of data lines to the sense amplifier columns comprises a plurality of selection circuits respectively coupled between each sense amplifier column and the first set of data lines.

15. The dual access DRAM of claim 14 wherein each selection circuit comprises:
- a first transistor having a current path coupled between the sense amplifier column and a non-inverted data line, and a gate for receiving a selection control signal; and
- a second transistor having a current path coupled between the sense amplifier column and an inverted data line, and a gate for receiving the selection control signal.

16. The dual access DRAM of claim 14 wherein each selection circuit comprises:
- a first transistor having a current path coupled between a first plurality of sense amplifiers in the sense amplifier column and a non-inverted data line, and a gate for receiving a first selection control signal;
- a second transistor having a current path coupled between the first plurality of sense amplifiers in the sense amplifier column and an inverted data line, and a gate for receiving the first selection control signal;
- a third transistor having a current path coupled between a second plurality of sense amplifiers in the sense amplifier column and a non-inverted data line, and a gate for receiving a second selection control signal; and
- a fourth transistor having a current path coupled between the second plurality of sense amplifiers in the sense amplifier column and an inverted data line, and a gate for receiving the second selection control signal.

17. The dual access DRAM of claim 13 wherein each selection circuit comprises:
- a first transistor having a current path coupled between the sense amplifier column and a non-inverted data line, and a gate for receiving a selection control signal; and
- a second transistor having a current path coupled between the sense amplifier column and an inverted data line, and a gate for receiving the selection control signal.

18. The dual access DRAM of claim 13 wherein each selection circuit comprises:
- a first transistor having a current path coupled between a first plurality of sense amplifiers in the sense amplifier column and a non-inverted data line, and a gate for receiving a first selection control signal;
- a second transistor having a current path coupled between the first plurality of sense amplifiers in the sense amplifier column and an inverted data line, and a gate for receiving the first selection control signal;
- a third transistor having a current path coupled between a second plurality of sense amplifiers in the sense amplifier column and a non-inverted data line, and a gate for receiving a second selection control signal; and
- a fourth transistor having a current path coupled between the second plurality of sense amplifiers in the sense amplifier column and an inverted data line, and a gate for receiving the second selection control signal.

19. The dual access DRAM of claim 13 in which the second set of data lines is used to simultaneously transfer data between a second DRAM subarray and a third DRAM subarray.

* * * * *